(12) United States Patent
Hayashi et al.

(10) Patent No.: US 7,696,513 B2
(45) Date of Patent: Apr. 13, 2010

(54) LIGHT-EMITTING DEVICE USING OXIDE SEMICONDUCTOR THIN-FILM TRANSISTOR AND IMAGE DISPLAY APPARATUS USING THE SAME

(75) Inventors: Ryo Hayashi, Yokohama (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/282,721

(22) PCT Filed: Mar. 2, 2007

(86) PCT No.: PCT/JP2007/054601

§ 371 (c)(1),
(2), (4) Date: Sep. 12, 2008

(87) PCT Pub. No.: WO2007/119321

PCT Pub. Date: Oct. 25, 2007

(65) Prior Publication Data

US 2009/0072233 A1   Mar. 19, 2009

(30) Foreign Application Priority Data

Mar. 17, 2006   (JP) .............................. 2006-074631

(51) Int. Cl.
*H01L 21/16* (2006.01)

(52) U.S. Cl. .............................. 257/43; 257/40; 257/59; 257/72; 257/83; 257/E51.001; 438/70; 313/491; 345/76

(58) Field of Classification Search ................... 257/40, 257/43, 59, 72, 79, 83, 103, E39.007, E51.001, 257/E51.003, E51.008, 88, 89–100; 438/70; 313/491; 345/76, 87

See application file for complete search history.

(56) References Cited

U.S. PATENT DOCUMENTS

2003/0205763 A1* 11/2003 Park et al. ................ 257/359

(Continued)

FOREIGN PATENT DOCUMENTS

JP        05-251705        9/1993

(Continued)

OTHER PUBLICATIONS

Nomura et al., "Room-temperature Fabrication of Transparent Flexible Thin-film Transistors Using Amorphous Oxide Semiconductors," *Nature*, vol. 432, 488-492 (2004).

(Continued)

*Primary Examiner*—Lynne A Gurley
*Assistant Examiner*—Yosef Gebreyesus
(74) *Attorney, Agent, or Firm*—Fitzpatrick, Cella, Harper & Scinto (57) ABSTRACT

The present invention provides a light-emitting device, including: a pixel region provided on a substrate and including a blue pixel region, a green pixel region, and a red pixel region which correspond to lights of three primary colors of blue, green and red light, respectively, the pixel region including: a thin-film transistor having a source electrode, a drain electrode, a gate electrode, a gate insulating film, and an active layer; a light-emitting layer; and a lower electrode and a counter electrode for sandwiching the light-emitting layer therebetween, wherein the active layer includes an oxide; the drain electrode is electrically connected with a part of the light-emitting layer; and the thin-film transistor is arranged in a region other than the blue pixel region on the substrate.

8 Claims, 6 Drawing Sheets

U.S. PATENT DOCUMENTS

| | | | |
|---|---|---|---|
| 2004/0130512 A1 | 7/2004 | Nakanishi | 345/76 |
| 2004/0155846 A1 | 8/2004 | Hoffman et al. | 345/87 |
| 2005/0140291 A1 | 6/2005 | Hirakata et al. | 313/512 |
| 2006/0113549 A1* | 6/2006 | Den et al. | 257/79 |
| 2006/0152151 A1* | 7/2006 | Seo | 313/506 |
| 2007/0194379 A1 | 8/2007 | Hosono et al. | 257/347 |

FOREIGN PATENT DOCUMENTS

| | | |
|---|---|---|
| JP | 07-235219 | 9/1995 |
| JP | 09-114398 | 5/1997 |
| JP | 2000-044236 | 2/2000 |
| JP | 2002-076356 | 3/2002 |
| JP | 2004-184530 | 7/2004 |
| WO | WO 2005-088726 A1 | 9/2005 |
| WO | WO 2005/093848 A1 | 10/2005 |
| WO | WO 2005/093850 A1 | 10/2005 |
| WO | WO 2005/093851 A1 | 10/2005 |

OTHER PUBLICATIONS

Nomura et al., "Thin-film Transistor Fabricated in Single-Crystalline Transparent Oxide Semiconductor," *Science*, vol. 300, 1269-1272 (2003).

Tung et al., "49.3: A 200-dpi Transparent a-Si TFT Active-Matrix Phosphorescent OLED Display," *SID 05 Digest*, pp. 1546-1549 (2005).

Bae et al., "Photodetecting Properties of ZnO-based Thin-film Transistors," *Applied Physics Letters*, vol. 83, No. 25, 5313-5315 (2003).

Nomura et al., "Carrier Transport in Transparent Oxide Semiconductor with Intrinsic Structural Randomness Probed Using Single-crystalline $InGaO \cdot (ZnO)_5$ Films," *Applied Physics Letters*, vol. 85, No. 11, 1993-1995.

Barquinha et al., "Effect of UV and Visible Light Radiation on the Electrical Performances of Transparent TFTs Based on Amorphous Indium Zinc Oxide," *Journal of Non-Crystalline Solids*, vol. 352, 1756-1760 (2006).

Fortunato et al., "Wide-bandgap High-mobility ZnO Thin-film Transistors Produced at Room Temperature," *Applied Physics Letters*, vol. 85, No. 13, 2541-2543 (2004).

Shibuya et al., "Single Crystal $SrTiO$, Field-effect Transistor with an Atomically Flat Amorphous $CaHfO_3$ Gate Insulator," *Applied Physics Letters*, vol. 85, No. 3, 425-427 (2004).

Heo et al., "Depletion-mode ZnO Nanowire Field-effect Transistor," *Applied Physics Letters*, vol. 85, No. 12, 2274-2276 (2004).

Kwon et al., "Enhancement-mode Thin-film Field-effect Transistor Using Phosphorus-doped (Zn,Mg)O Channel," *Applied Physics Letters*, vol. 84, No. 14, 2685-2687 (2004).

Fortunato et al., "High Field-effect Mobility Zinc Oxide Thin Film Transistors Produced at Room Temperature," *Journal of Non-Crystalline Solids*, 338-340, pp. 806-809 (2004).

Carcia et al., "Transparent ZnO Thin-film Transistor Fabricated by rf Magetron Sputtering," *Applied Physics Letters*, vol. 82, No. 7, 1117-1119 (2003).

Hoffman et al., "ZnO-based Transparent Thin-film Transistors," *Applied Physics Letters*, vol. 82, No. 5, 733-735 (2003).

Nishii et al., "High Mobility Thin Film transistors with Transparent ZnO Channels," *Jpn. J. Appl. Phys.*, vol. 42, L347-L349 (2003).

Ohya et al., "Thin Film Transistor of ZnO Fabricated by Chemical Solution Deposition," *Jpn. J. Appl. Phys.*, vol. 40, 297-298 (2001).

Yabuta et al., "High-mobility Thin-film Transistor with Amorphous $InGaZnO_4$ Channel Fabricated by Room Temperature rf-magnetron Sputtering," *Applied Physics Letters*, vol. 89, 112123-1-12123-3 (2006).

Takagi et al., "Carrier Transport and Electronic Structure in Amorphous Oxide Semiconductor, $a-InGaZnO_4$," *Thin Solid Films*, vol. 486, 38-41 (2005).

Nomura et al., "Carrier Transport of Extended and Localized States In $InGaO_3 (ZnO)_5$," *Mat. Res. Soc. Symp. Proc.*, vol. 811, E2.9.1-E2.9.6. (2004).

* cited by examiner

LIGHT-EMITTING DEVICE USING OXIDE SEMICONDUCTOR THIN-FILM TRANSISTOR AND IMAGE DISPLAY APPARATUS USING THE SAME

TECHNICAL FIELD

The present invention relates to a light-emitting device using an oxide semiconductor thin-film transistor, and more particularly, to a top-emission, bottom-emission, or both-side emission light-emitting device using an organic EL element or an inorganic EL element for a light-emitting layer; and to an image display apparatus using the light-emitting device.

BACKGROUND ART

The International Publication WO 2005/088726 discloses a technique of using a transparent amorphous oxide semiconductor film containing indium, gallium, zinc, and oxygen as the channel layer (also called active layer) of a thin-film transistor (TFT). The transparent amorphous oxide semiconductor film can be formed at a low temperature and is transparent to visible light, and thereby a flexible transparent TFT can be formed on a substrate such as a plastic plate or a plastic film.

Nature, vol. 432, pp. 488-492 (2004) discloses that a transparent amorphous oxide semiconductor film having a composition ratio of In:Ga:Zn being 1.1:1.1:0.9 according to an X-ray fluorescence method has a transmittance of approximately 80% or more to visible light. It also describes that a transparent TFT can be formed. According to Japanese Patent Application Laid-Open No. 2002-76356, developments are actively made in a TFT using, as the channel layer, a transparent conductive oxide polycrystalline thin-film containing ZnO as a main ingredient.

In recent years, a light-emitting device utilizing organic electroluminescence (EL) has been actively researched and developed. When the organic EL element is applied to a display, active matrix driving is typically performed. For the active matrix driving, a TFT made of amorphous silicon or polycrystalline silicon is normally employed.

There is proposed an active matrix organic EL display for the purpose of providing a high-quality and high-luminance display capable of preventing deterioration of a driving element and also capable of performing television video display. Japanese Patent Application Laid-Open No. H09-114398 discloses that an organic EL display using two MOS field effect transistors each of which includes an active layer made of single crystalline silicon obtains high quality and prevents the deterioration of the driving element.

As a result of studies made by the present inventors in order to manufacture a transparent field effect transistor using a transparent amorphous oxide semiconductor film, the present inventors have found a phenomenon in which electric conductivity changes under visible light having a specific wavelength.

In order to examine the phenomenon in details, the present inventors performed experiments for measuring electric conductivity during spectral light irradiation (spectral sensitivity measurement experiments) as described later. As a result, the present inventors have found that the electric conductivity changes (increases) in a short-wavelength range side of visible light because of light absorption (see FIG. 9).

Figure 9:
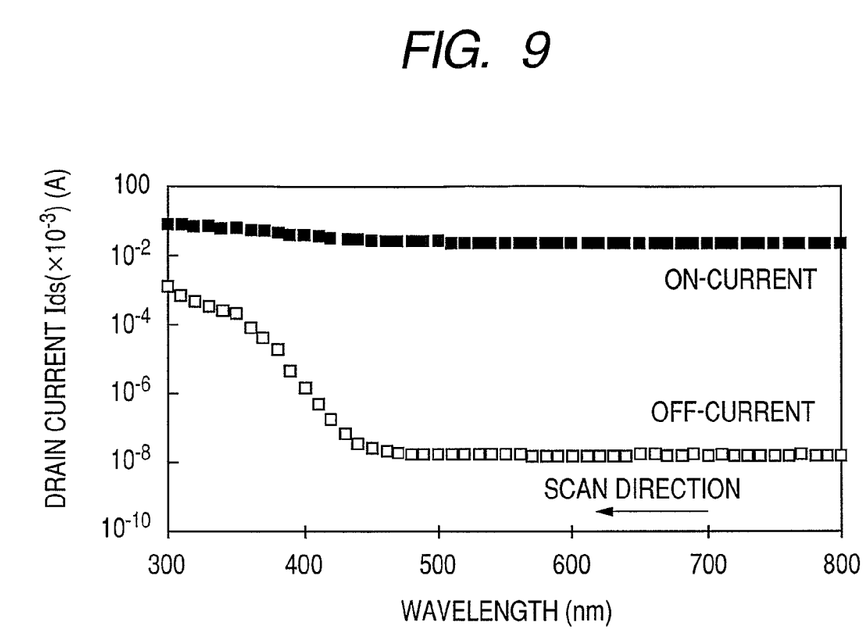
FIG. 9 is a graph showing a result obtained by measurement made on an on-current and an off-current of the top-gate MISFET device manufactured in Example 2 of the present invention.

FIG. 9 is a graph showing the plotting of drain currents at every wavelengths of irradiated spectral light at the time of on-operation and at the time of off-operation of a thin-film transistor (TFT) when the TFT is irradiated with every 10 nm at the wavelengths of spectrum of visible light having a constant strength. In the case of irradiation with visible light, the off-current of the TFT is significantly changed at the time of irradiation of light, particularly on a short-wavelength side. This change affects the stable operation of the TFT. That is, the present inventors have found for the first time that, in an actual transparent amorphous oxide which is considered as being transparent to visible light, a change in electric conductivity due to light excitation, that is, the generation of photo carriers actually occurs in a visible light range.

Further, the present inventors have found a problem that, even in a case where a material which is normally considered as being transparent oxide (that is, oxide which does not absorb light) is used for the active layer of the TFT, when the TFT and the light-emitting device are combined with each other for operation, the operation of the TFT becomes unstable because the TFT absorbs a part of short-wavelength light emitted from the light-emitting device.

In order to prevent the light from affecting the characteristics of such element, a light shielding unit such as a light shielding film is normally provided. However, when the light shielding unit is provided, the degree of freedom of design in a device structure significantly reduces which utilizes the transparency of the active layer, that is, the active layer itself of the TFT as a window layer.

DISCLOSURE OF THE INVENTION

In view of the above-mentioned circumstances, an object of the present invention is to provide a light-emitting device using a transparent oxide semiconductor thin-film transistor which is capable of being stably operated without using the light shielding unit.

In order to attain the above-mentioned object, the present invention provides a light-emitting device, including: a pixel region provided on a substrate and including a blue pixel region, a green pixel region, and a red pixel region which correspond to lights of three primary colors of blue, green and red, respectively, the pixel region including: a thin-film transistor having a source electrode, a drain electrode, a gate electrode, a gate insulating film, and an active layer; a light-emitting layer; and a lower electrode and a counter electrode for sandwiching the light-emitting layer therebetween, wherein the active layer includes an oxide; the drain electrode is electrically connected with a part of the light-emitting layer; the thin-film transistor is arranged in a region other than the blue pixel region on the substrate; and the thin-film transistor is provided with no light-shielding film.

In the light-emitting device according the present invention, the thin-film transistor may desirably be provided in at least one of the green pixel region and the red pixel region. The active layer may include an oxide having a transmittance of 70% or more to light in a wavelength range of 400 nm to 800 nm. The oxide of the active layer may contain In, Ga, and Zn, and may have an electron carrier concentration smaller than $10^{18}/cm^3$, and at least a part of the oxide may be an amorphous oxide.

In the light-emitting device according to the present invention, at least one of the source electrode, the drain electrode, and the gate electrode may include a transparent conductive oxide. The lower electrode may include a transparent conductive oxide. At least one of the source electrode, the drain electrode, the gate electrode, and the lower electrode may contain In, Ga, and Zn, and may have an electron carrier concentration of $10^{18}/cm^3$ or more, and at least a part of the oxide may be an amorphous oxide. The light-emitting layer may include an organic EL element.

An image display apparatus according to the present invention is constructed by using any of the above-described light-emitting devices.

Further features of the present invention will become apparent from the following description of exemplary embodiments with reference to the attached drawings.

BEST MODE FOR CARRYING OUT THE INVENTION

Hereinafter, a light-emitting device according to an embodiment of the present invention will be described with reference to the attached drawings.

The embodiment of the present invention is applied to a light-emitting device using the above-mentioned transparent film. Specifically, the present embodiment is applied to a light-emitting device which is driven by TFT including a semiconductor film which is the above-mentioned transparent film, and more particularly, to a light-emitting device which emits light by driving an organic EL element and is used for a light source or a display for color display using three-primary-color pixels.

Visible light is normally considered as light having a wavelength of approximately 400 nm to approximately 800 nm. In a case where a material is regarded as transparent, it may be normally the case where the transmittance of the material is 70% or more. According to the description of Nature, vol. 432, pp. 488-492 (2004) (see FIG. 2) described above, an oxide used in this embodiment has transmittance of at least 70% or more.

Therefore, the transparent oxide in this embodiment is defined as an oxide having a light transmittance of 70% or more to light having a wavelength range of 400 nm to 800 nm (visible light). The transparent oxide in this embodiment includes not only an oxide having the light transmittance of 70% or more to light having the entire wavelength range of 400 nm to 800 nm but also an oxide having the light transmittance of 70% or more at a wavelength which is a part of the above-mentioned wavelength range.

As regards the point that the transparency of the oxide to light having the above-described wavelength range is high, the oxide desirably has a transmittance of 80% or more, more desirably 90% or more.

Figure 1:
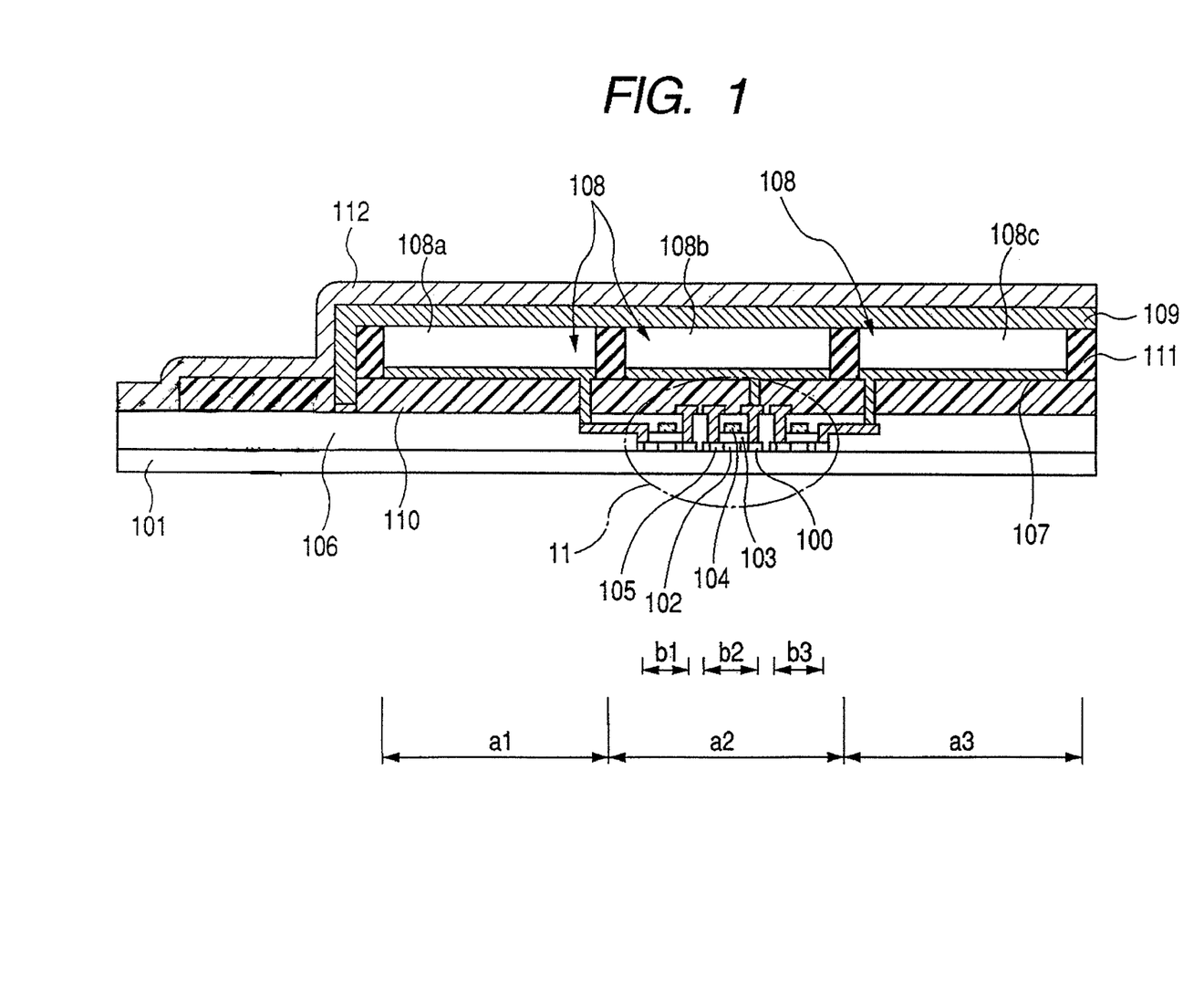
FIG. 1 is a schematic cross-sectional view showing a structure of a light-emitting device according to an embodiment of the present invention.

FIG. 1 shows an example of a fundamental structure of the light-emitting device according to this embodiment. The light-emitting device is a bottom-emission light-emitting device including three-primary-color pixels for emitting blue, green and red lights (blue pixel, green pixel, and red pixel) which are provided in a pixel region on a substrate.

In FIG. 1, an active layer (channel layer) 102 made of a specific semiconductor material in the present invention, a drain electrode 100, a source electrode 105, a gate insulating layer 103, and a gate electrode 104 are formed on or above a substrate (glass substrate) 101, thereby constructing each of TFTs (pixel region transparent oxide TFTs) 11 located in the pixel region (pixel portion region) of the light-emitting device. In each of the TFTs 11, the source electrode 105 and the drain electrode 100 are directly connected with the active layer 102. A drain current flowing through the active layer 102 between the source electrode 105 and the drain electrode 100 is controlled by a gate voltage applied to the gate electrode 104 through the gate insulating layer 103.

A lower electrode 107, an organic light-emitting layer 108, and the counter electrode 109, and a passivation film 112 are arranged on or above the TFT 11 through an interlayer insulating layer 106 and a planarizing film 110. The lower electrode 107 is located under the organic light-emitting layer 108 (on the substrate side). The lower electrode 107 is connected with the drain electrode 100 of the TFT 11 through a contact hole. The lower electrode 107 is electrically insulated from a portion other than the drain electrode 100 of the TFT 11 through the interlayer insulating layer 106 and the planarizing film 110. The counter electrode 109 is located on the organic light-emitting layer 108. When the TFT is in an ON state, a voltage is applied to the organic light-emitting layer 108 located between the lower electrode 107 and the counter electrode 109 to emit light therefrom.

The organic light-emitting layer 108 includes a blue light-emitting layer 108a, a red light-emitting layer 108b, and a green light-emitting layer 108c provided in a blue pixel region a1, a red pixel region a2, and a green pixel region a3, respectively, which constitute a pixel region on the glass substrate 101. The light-emitting layers 108a, 108b, and 108c are located adjacent to one another through an element isolation film 111.

In FIG. 1, the active layer of each of the TFTs 11 arranged in the pixel region on the glass substrate 101 is made of a transparent oxide. The transparent oxide in this embodiment (for example, transparent amorphous oxide) causes a phenomenon in which photo carriers generate in a short-wavelength range of visible light. For example, in the case of the transparent amorphous oxide, tail absorption which may be caused by a disturbance resulting from the amorphous structure or defect levels appears in the optical band gap. Even when, for example, ZnO having a crystalline structure (optical band gap 3.35 eV: 370 nm) is used, there occurs a case where absorption caused by crystal grain boundaries or defect levels in a normal polycrystal appears in a visible light wavelength range of 400 nm or more.

Therefore, in this embodiment, the TFTs 11 are provided in a region other than the blue pixel (ideal blue light emission peak is 470 nm) region a1 which is irradiated with light having a wavelength range of at least 400 nm to 500 nm. Specifically, the TFTs 11 are provided above or under the organic light-emitting layer 108 located in the green pixel region a3 or the red pixel region a2.

FIG. 1 shows the example in which the TFTs 11 are provided under the red light-emitting layer 108b located in the red pixel region a2. In FIG. 1, TFT b1 for a blue pixel, TFT b2 for a red pixel, and TFT b3 for a green pixel are located in the red pixel region a2.

FIG. 1 shows the example in which the red light-emitting layer 108b of the organic light-emitting layer 108 is located above the TFT 11. However, the present invention is not limited to such a structure. For example, it is possible to employ a structure in which the red light-emitting layer 108b and the green light-emitting layer 108c of the organic light-emitting layer 108 are formed above the TFTs 11. In order words, it is only necessary to employ a structure in which the blue light-emitting layer 108a of the organic light-emitting layer 108 is not located above the TFTs 11.

Figure 2:
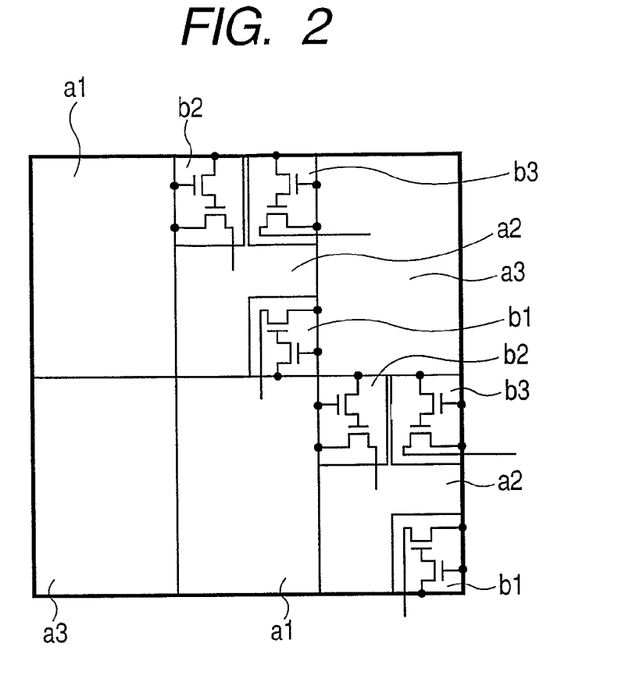
FIG. 2 is a schematic diagram showing the light-emitting device according to the embodiment of the present invention in a case where TFTs are arranged in red pixel regions.
Figure 3:
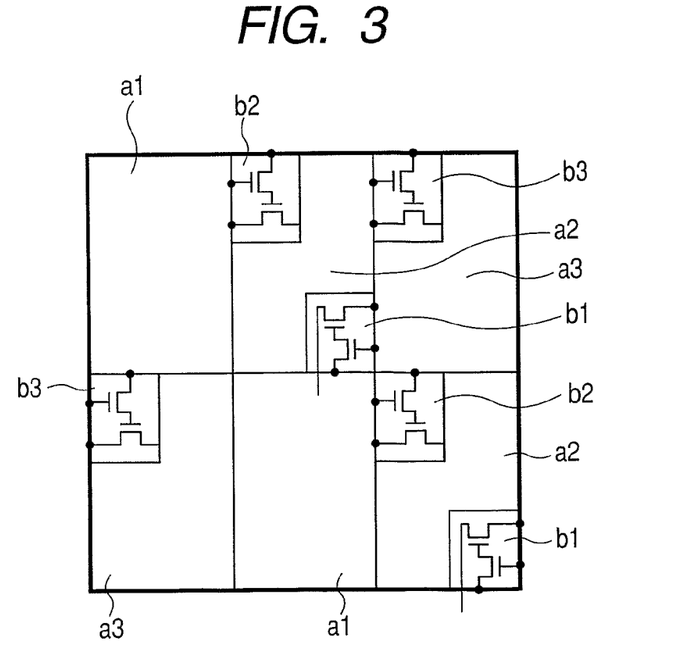
FIG. 3 is a schematic diagram showing the light-emitting device according to the embodiment of the present invention in a case where TFTs are arranged in red pixel regions and green pixel regions.
Figure 4A:
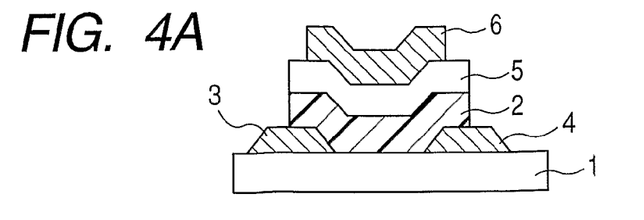
FIGS. 4A, 4B, 4C and 4D each are a schematic cross-sectional view showing a thin-film transistor used in the embodiment of the present invention.
Figure 4B:
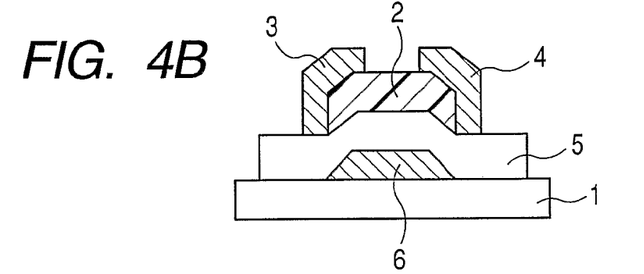
Figure 4C:
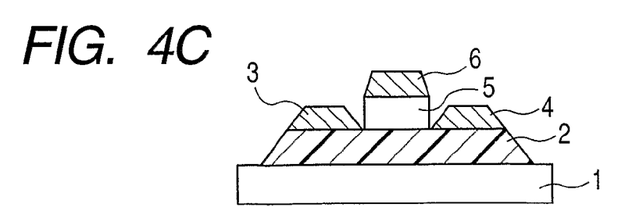
Figure 4D:
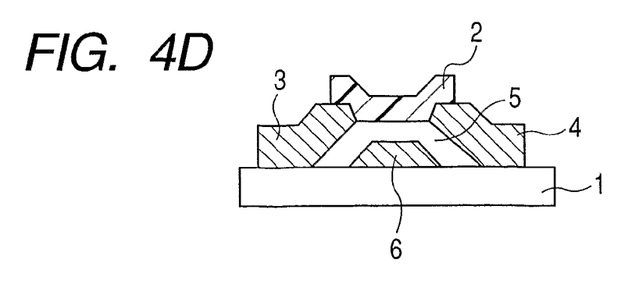

FIGS. 2 and 3 are schematic diagrams showing an arrangement of the TFTs 11 in the respective color pixel regions. FIGS. 2 and 3 show the arrangement of the TFTs located in the pixel regions of a color display light-emitting device using three-primary-color pixels.

FIG. 2 shows an example in which the transparent oxide TFTs 11 are located in only the red pixel region a2. According to this example, in addition to the red pixel TFT b2, the blue pixel TFT b1 and the green pixel TFT b3 are located in only the red pixel region a2.

FIG. 3 shows an example in which the transparent oxide TFTs 11 are located in the red pixel region a2 and the green pixel region a3. According to this example, in addition to the red pixel TFT b2, the blue pixel TFT b1 is located in the red pixel region a2. The green pixel TFT b3 is located in the green pixel region a3.

In addition, the transparent oxide TFTs 11 may be located in only the green pixel region a3. In this case, in addition to the green pixel TFT b3, the blue pixel TFT b1 and the red pixel TFT b2 are located in the green pixel region a3. In other words, when the transparent oxide TFTs 11 are located in the region(s) other than the blue pixel region a1, any of the TFT arrangements can be applied.

Therefore, according to this embodiment, when such a structure is employed, it is possible to obtain a light-emitting device which eliminates the operational instability of the TFTs which is caused by a change in intensity of light emitted from the blue pixel to perform a stable operation without using the light shielding unit. In addition, it is possible to provide a light-emitting device using a substrate which is light in weight and resistant to break, such as a plastic substrate, or a substrate having flexibility, and a light-emitting device having a structure in which an aperture ratio does not reduce even in the case of a bottom-emission type or a structure capable of performing both-side light emission.

This embodiment shows the example in which the organic light-emitting layer 108 is provided above the TFTs 11. A structure longitudinally reverse to the structure shown in FIG. 1 may be employed to form the TFTs 11 above the red light-emitting layer 108b and the green light-emitting layer 108c. In this case, the lower electrode 107 adjacent to the organic light-emitting layer 108 is apparently located thereabove. When the lower electrode 107 is connected with the drain electrode 100, the same function is obtained. The planarizing film 110 can be omitted, so that it is advantageous in manufacturing cost of the light-emitting device.

When a portion of the active layer 102 (In—Ga—Zn—O film) located under the drain electrode 100 is set to have a carrier concentration of $10^{18}/cm^3$ or more, it can serve as both the drain electrode 100 and the lower electrode 107. In this case, it is desirable that the In—Ga—Zn—O film of the active layer 102 serve as a hole injection layer and be connected with an anode portion of the organic light-emitting layer 108.

Next, respective constituent components of the light-emitting device according to the present invention will be described in detail.

1. Substrate

A glass substrate is normally used for the light-emitting device. In this embodiment, the glass substrate is used. The substrate to be used in the present invention is not limited to this. Fundamentally, only flatness is necessary. The TFT to be used in the present invention can be formed at a low temperature, so that it is possible to employ the plastic substrate which is normally difficult to use for the active matrix structure. Therefore, the light-emitting device which is light in weight and resistant to break is obtained, with the result that it can be bent to some extent. In addition, it is possible to use a semiconductor substrate or a ceramic substrate, which includes Si. In the case of flatness, a metal substrate on which an insulating layer is provided can be used.

2. TFT

A TFT includes a three terminal device having a gate terminal, a source terminal, and a drain terminal. The TFT uses a semiconductor thin film formed on an insulating substrate made of ceramic, glass, plastic, or the like as an active layer (channel layer) through which electrons or holes move. Further, the TFT is an active device having a function for controlling a current flowing through the channel layer in accordance with a voltage applied to the gate terminal to control switching of a current flowing between the source terminal and the drain terminal.

As shown in FIGS. 4A to 4D, any of a stagger (top-gate) TFT (FIG. 4A), a reverse stagger (bottom-gate) TFT (FIG. 4B), a coplanar TFT (FIG. 4C), and a reverse coplanar TFT (FIG. 4D) can be applied to the TFT structure. In FIGS. 4A to 4D, on or above a substrate 1, an active layer (channel layer) 2, a source terminal (source electrode) 3, a drain terminal (drain electrode) 4, a gate insulating film 5, and a gate terminal (gate electrode) 6 are formed.

Any of a single-crystalline oxide, a polycrystalline oxide, an amorphous oxide, and mixtures thereof can be applied to the transparent oxide. The polycrystalline oxide is, for example, ZnO or ZnGaO. The amorphous oxide is described in detail in the pamphlet of WO 2005/088726.

In this embodiment, a description will be made of a case where an amorphous oxide is applied to an active layer material. As an active layer of a normally-off TFT, an oxide film having an electron carrier concentration of less than $10^{18}/cm^3$ is desirably used. Specifically, the oxide film includes In, Ga, Zn and O, and its composition in a crystalline state is represented by $InGaO_3(ZnO)_m$ (where m represents a natural number of less than 6). Alternatively, the oxide film includes In, Ga, Zn, Mg and O, and its composition in a crystalline state is represented by $InGaO_3(Zn_{1-x}Mg_xO)_m$ (where m represents a natural number of less than 6 and $0<x\leq1$).

Further, the electron mobility of the oxide materials increases with increasing number of conduction electrons. A glass substrate, a plastic substrate or a plastic film made of a resin, or the like can be used as a substrate for forming a TFT thereon. Further, an amorphous oxide film having a small electron carrier concentration and a large electron mobility can be produced with an amorphous oxide formed of an oxide of at least one element of Zn, In, and Sn. The amorphous oxide film has specific property of increasing the electron mobility with increasing number of conduction electrons. A normally-off TFT excellent in transistor characteristics such as an on-off ratio, a saturation current in a pinch-off state, and a switching speed can be produced with the film.

For the semiconductor layer, it is possible to use an amorphous oxide containing at least one element of Sn, In, and Zn. Further, when Sn is to be selected as at least one of constituent elements of the amorphous oxide, Sn can be substituted with $Sn_{1-x}M4_x$ (where $0<x<1$, and M4 is selected from the group consisting of Si, Ge and Zr which are group IV elements having an atomic number smaller than that of Sn). Further, when In is to be selected as at least one of constituent elements of the amorphous oxide, In can be substituted by $In_{1-y}M3_y$ (where $0<y<1$, and M3 is selected from the group consisting of Lu and Y as well as B, Al and Ga which are group III elements having an atomic number smaller than that of In). When Zn is to be selected as at least one of constituent elements of the amorphous oxide, Zn can be substituted by $Zn_{1-z}M2_z$ (where $0<Z<1$, and M2 is selected from the group consisting of Mg and Ca which are group II elements having an atomic number smaller than that of Zn).

The amorphous material including a Sn—In—Zn oxide, an In—Zn—Ga—Mg oxide, an In oxide, an In—Sn oxide, an In—Ga oxide, an In—Zn oxide, a Zn—Ga oxide and an Sn—In—Zn oxide can be applied. A composition ratio of constituent materials is not necessarily set to 1:1. When Zn or Sn is used alone, it may be difficult to produce an amorphous. However, when In is added thereto, it is easy to produce an amorphous phase. For example, in the case of In—Zn system, a ratio of the number of atoms except for oxygen is desirably adjusted to obtain a composition having a In concentration of approximately 20 atomic % or more. In the case of Sn—In system, the ratio of the number of atoms except for oxygen is desirably adjusted to obtain a composition having a In concentration of approximately 80 atomic % or more. In the case of Sn—In—Zn system, a ratio of the number of atoms except for oxygen is desirably adjusted to obtain a composition having a In concentration of approximately 15 atomic % or more.

When a clear diffraction peak is not detected (that is, halo pattern is observed) in the case where X-ray diffraction is performed on a thin film as a measurement target at a low incident angle of approximately 0.5 degrees, it can be determined that the thin film is amorphous. In this embodiment, when any one of the above-mentioned materials is used for the channel layer of the thin-film transistor, it is not excluded that the channel layer contains a constituent material with a microcrystal state. Microcrystals existing in the amorphous oxide can be confirmed, for example, using a transmission electron microscope.

In a thin-film transistor using the above-described transparent oxide film, it is desirable to use $Al_2O_3$, $Y_2O_3$, or $HfO_2$, or a mixed crystal compound containing at least two of those compounds, for a gate insulating film. When a defect exists in an interface between the gate insulating film and the thin-film of the channel layer, the electron mobility reduces and hysteresis occurs in the transistor characteristics. A leakage current is significantly changed according to the type of the gate insulating film. Therefore, it is necessary to select a gate insulating film suitable for the channel layer. When an $Al_2O_3$ film is used, the leakage current can be reduced. When a $Y_2O_3$ film is used, the hysteresis can be made smaller. When an $HfO_2$ film having a high dielectric constant is used, the electron mobility can be increased. When a mixed crystal film thereof is used, it is possible to produce a TFT having a small leakage current, small hysteresis and a large electron mobility. The gate insulating film forming process and the channel layer forming process can be performed at room temperature, so that any of the stagger structure and the reverse stagger structure can be formed as the TFT structure.

3. Interlayer Insulating Layer

A material of the gate insulating layer can be used as such for an insulating layer serving as a base of the lower electrode. For planarization, another insulating layer can be formed. Also, it is possible to form the insulating layer, for example, by forming a polyimide film by spin coating, or forming a silicon oxide by a plasma CVD method, a PECVD method, or an LPCVD method, or applying and baking alkoxide or the like. It is suitably necessary to form contact holes for connection with the source and the drain in the interlayer insulating layer.

4. Lower Electrode

The lower electrode and the drain electrode of the TFT which is connected therewith may be the same or different in composition. When the light-emitting layer is a current injection layer represented by an organic EL layer, a desirable lower electrode depends on the structure. For example, when the light-emitting layer connected with the lower electrode is an anode, it is desirable to use a metal material having a large work function. Examples of the material include ITO, conductive tin oxide, conductive ZnO, In—Zn—O, a Pt alloy, and an Au alloy. In addition, an In—Ga—Zn—O material having an electron carrier concentration of $10^{18}/cm^3$ or more can be used. In this case, a high carrier concentration, for example, a carrier concentration of $10^{19}/cm^3$ or more is desirable unlike the case of the TFT. In the case of direct connection with the drain portion of the TFT, ITO, the In—Ga—Zn—O material (high carrier concentration), or an Au alloy is particularly desirable.

The lower electrode made of ITO or the In—Ga—Zn—O material (high carrier concentration) is transparent. Therefore, even in the case of the bottom-emission type, the aperture ratio can be increased.

In contrast to the above, when the light-emitting layer connected with the lower electrode is a cathode, it is desirable to use a metal material having a small work function. Examples of the material include Ag-added Mg, Li-added Al, silicide, boride, and nitride. In this case, the connection with the drain portion of the TFT through a wiring is more convenient than the directly connection therewith.

When the drain electrode is to be directly connected with the lower electrode, it is desirable that the lower electrode be a hole injection electrode. In particular, it is desirable to use ITO, Al, or ZnO doped with Ga, or an In—Ga—Zn—O material having a carrier concentration of $10^{18}/cm^3$ or more for the lower electrode. In particular, in the case of the In—Ga—Zn—O material, the carrier concentration of a portion of the active layer can be increased by, for example, an oxygen defect introduction method to form the lower electrode. Therefore, the structure becomes simple and effective. In such a case, it appears that a hole transport layer and a hole injection layer are formed on the active layer. Such a structure is also within the scope of the present invention. This means that the lower electrode and the drain electrode are integrally formed with the portion of the active layer.

5. Light-Emitting Layer

Although the light-emitting layer is not limited as long as it can be driven by the transparent oxide TFT, an organic EL element is particularly convenient. The organic light-emitting layer used in this embodiment is a single layer in few cases and thus normally has any of the following multiple-layer structures.

(1) Hole transport layer/light-emitting layer+electron transport layer (corresponding to light-emitting layer having electron transport function)

(2) Hole transport layer/light-emitting layer/electron transport layer (3) Hole injection layer/hole transport layer/light-emitting layer/electron transport layer (4) Hole injection layer/hole transport layer/light-emitting layer/electron transport layer/electron injection layer In addition, there is the case where an electron barrier layer, an adhesion promoting layer, and the like are further provided.

There is the case where fluorescence or phosphorescence is used in a light-emitting layer portion. It is effective to use the phosphorescence in view of light emission efficiency. Iridium complex is useful as a phosphorescent material. As a molecule to be used, both of a molecule having a low molecular weight and a polymer can be utilized. In the case of the molecule having a low molecular weight, the light-emitting layer portion can be normally formed by vapor deposition. In the case of the polymer, the light-emitting layer portion can be normally formed by ink jet or printing. Examples of the molecule having a low molecular weight include amine complexes, anthracenes, rare earth complexes, and noble metal complexes. Examples of the polymer include π-conjugation polymers and pigmented polymers.

A material for the electron injection layer includes alkali metal, alkaline earth metal, a compound thereof, or an organic compound doped with an alkali metal. A material for the electron transport layer includes aluminum complexes, oxadiazoles, triazoles, or phenanthrolines.

A material for the hole injection layer includes arylamines, phthalocyanines, or organic compounds doped with a Lewis acid. A material for the hole transport layer includes arylamines.

6. Counter Electrode

A preferred material for the counter electrode is changed depending on whether it is used in a top-emission type or a bottom-emission type and used as a cathode or an anode.

For example, in the case of the top emission type, it is necessary that the counter electrode be transparent. When the counter electrode is the anode, it is also possible to use indium tin oxide (ITO), conductive tin oxide, conductive ZnO, In—Zn—O, or an In—Ga—Zn—O material having an electron carrier concentration of $10^{18}/cm^3$ or more, which are the transparent conductive oxide. When the counter electrode is the cathode, an alloy doped with an alkali metal or alkaline earth metal is formed in a thickness of several 10 nm or less and the transparent conductive oxide is formed thereon, whereby the counter electrode can be obtained.

In the case of the bottom emission type, it is unnecessary that the counter electrode should be transparent. Therefore, an Au alloy, a Pt alloy, or the like can be used for the anode. In addition, Ag-added Mg, Li-added Al, silicide, boride, nitride, or the like can be used for the cathode.

7. Other Electrode Lines

Metals such as Al, Cr, or W, an Al alloy, silicides such as WSi or the like can be used for electrode lines including a scanning electrode line serving as a gate electrode line, a signal electrode line, or the like.

Next, a structural example in the case where the light-emitting device is applied to a display will be described with reference to FIG. 5.

Figure 5:
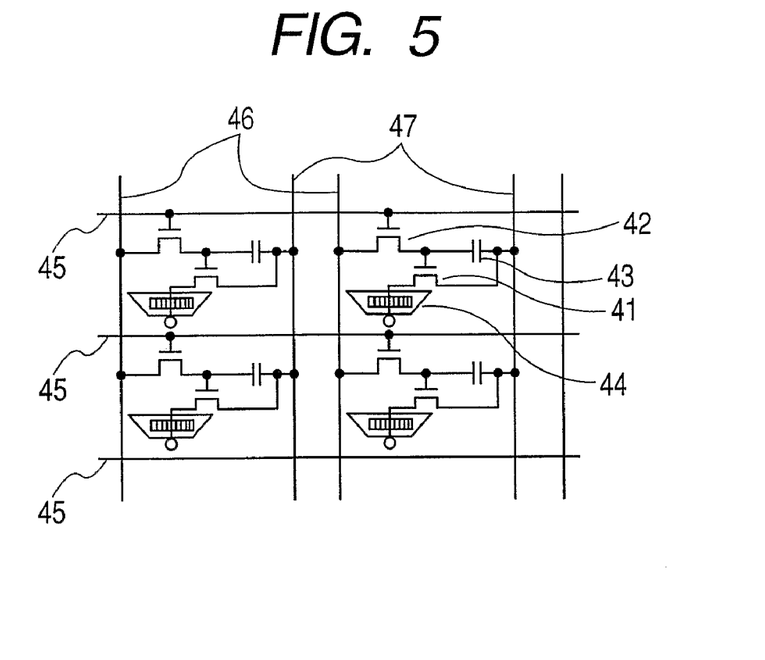
FIG. 5 is a circuit diagram of a light-emitting device according to the embodiment of the present invention in a case where the light-emitting device is used as a display.

In FIG. 5, a first transistor (driving transistor or switching transistor) 41 drives an organic EL layer 44, and a second transistor (pixel selection transistor) 42 selects a pixel. A capacitor 43 for maintaining a selected state, located between a common electrode line 47 and a source electrode of the second transistor 42, stores charges to hold a signal of a gate electrode of the first transistor. The pixel selection is determined by scanning electrode lines 45 and signal electrode lines 46.

More specifically, an image signal is applied as a pulse signal from a driver circuit (not shown) to a gate electrode of the second transistor 42 through the scanning electrode line 45. At the same time, a signal is applied from another driver circuit (not shown) to a drain electrode of the second transistor 42 through the signal electrode line 46, thereby selecting a pixel. At this time, the second transistor 42 is turned ON to store charges in the capacitor 43 located between the common electrode line 47 and the source electrode of the second transistor 42. Therefore, a gate voltage of the first transistor 41 is held to a desirable voltage, so that the first transistor 41 is turned on. Such a state is held until a next signal is received. While the first transistor 41 is in an on-state, a voltage and a current are being supplied to the organic EL layer 44 to maintain light emission.

In the example shown in FIG. 5, each pixel includes two transistors and one capacitor. In order to improve the performance, a larger number of transistors and the like may be incorporated thereinto. The essence of the present invention is to provide the oxide TFTs which are the transparent TFTs which can be formed at a low temperature in a region other than the blue pixel region, for example, the red light-emitting layer and the green light-emitting layer, thereby obtaining an effective light-emitting device.

As described above, according to this embodiment, a light-emitting device which is stably operated without using the light shielding unit can be provided by forming a light-emitting device using a semiconductor thin-film transistor of an oxide which is transparent. In addition, it is possible to provide a light-emitting device using a substrate which is light in weight and resistant to break, such as a plastic substrate, or a substrate having flexibility. Further, it is possible to provide a light-emitting device having a structure in which the aperture ratio does not reduce even in the case of the bottom-emission type or a structure capable of performing both-side light emission.

In this embodiment, the structural example of the organic EL element is described. Even in the case of an inorganic EL element, the same structure is possible.

Next, examples of the present invention will be described.

EXAMPLE 1

In this example, experiments for spectral sensitivity measurement were performed on the amorphous oxide used in the present invention.

First, an amorphous In—Ga—Zn oxide was formed on a substrate by a sputtering method. Specifically, the amorphous oxide was deposited in a thickness of 50 nm on a glass substrate (Corning 1737 glass produced by Corning Incorporated) by a high-frequency sputtering method under an atmosphere containing a gas mixture of oxygen and argon. A sintered body of In:Ga:Zn=1:1:1 was used as a target material. The reached vacuum degree in a growth chamber was $8 \times 10^{-4}$ Pa. The total pressure of oxygen and argon was $5.3 \times 10^{-1}$ Pa. The oxygen partial pressure was $1.8 \times 10^{-2}$ Pa.

A substrate temperature was not particularly set and thus film formation was performed without heating. The room temperature during the film formation was approximately 25° C. An X-ray was made incident on obtained films at an incident angle of 0.5 degrees relative to the film surface thereof to perform X-ray diffraction (by a thin film method). As a result, a clear peak was not detected, so that it was determined that all of the produced In—Zn—Ga—O films were amorphous films.

Further, as a result of X-ray reflectance measurement and pattern analysis, it was confirmed that the root-mean-square roughness (Rrms) of the thin film was approximately 0.5 nm and the film thickness thereof was approximately 50 nm.

Further, as a result of X-ray fluorescence (XRF) spectroscopy, the compositional ratio of metals in the thin film was In:Ga:Zn=1.00:0.94:0.65. From light absorption spectrum analysis, forbidden band energy width of the form amorphous thin film was approximately 3.1 eV.

An electrode having a diameter of 1 mm was formed on the obtained amorphous oxide film. Specifically, metal multilayer electrodes, each of which was made of Au (40 nm) and Ti (5 nm), were formed at an interval of 2 mm by mask vapor deposition to obtain a specimen to be measured. The Au layer was located on the uppermost side of each of the metal multilayer electrodes.

Figure 6:
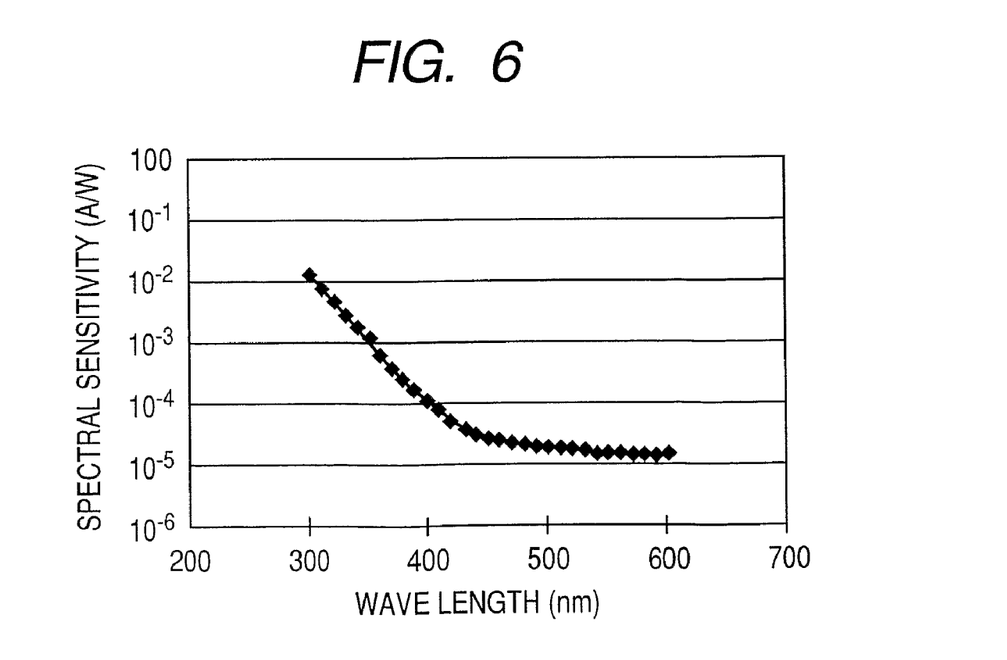
FIG. 6 is a graph showing a result obtained by spectral sensitivity measurement for an amorphous oxide produced in Example 1 of the present invention.

The electric conductivity measurement (spectral sensitivity characteristic evaluation) on the prepared specimen was performed during the irradiation of different-wavelength light beams (10 nm in interval) with a predetermined light intensity (2.5 mW/cm$^2$) at a bias voltage of 10 V. A CEP-2000 spectral sensitivity measurement apparatus was used for the measurement. FIG. 6 shows a result obtained by the measurement.

As is apparent form the result shown in FIG. 6, the produced amorphous film caused the generation of photoexcited carrier and an increase in conductivity in a short-wavelength range of the order of 450 nm (approximately 2.8 eV) corresponding to an energy smaller than approximately 3.1 eV which was the forbidden band energy width. A photoexcited carrier generation amount in the spectral sensitivity characteristic evaluation depended on an irradiation light intensity.

EXAMPLE 2

Figure 7:
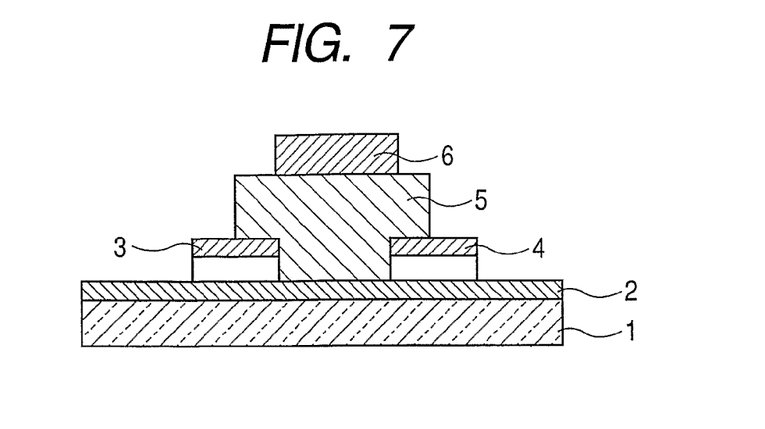
FIG. 7 is a schematic view showing a structure of a top-gate MISFET device manufactured in Example 2 of the present invention.

In this example, as shown in FIG. 7, a stagger (top-gate) metal-insulator-semiconductor field effect transistor (MISFET) device was manufactured.

First, a metal film was formed in a thickness of 30 nm on the glass substrate 1. The drain terminal 4 and the source terminal 3 were formed by a photolithography method and a lift-off method, and then an amorphous film (IGZO) which was used as the channel layer (active layer) 2 and had a metal composition ratio In:Ga:Zn=1.00:0.94:0.65 was formed thereon in a thickness of 30 nm by a sputtering method. An amorphous oxide film formation condition was the same as the condition of the evaluation experiments. Finally, a Y$_2$O$_3$ film used as the gate insulating film 5 was formed by an electron beam deposition method, a metal (Au) film was formed thereon, and the gate terminal 6 was formed by a photolithography method and a lift-off method.

Figure 8:
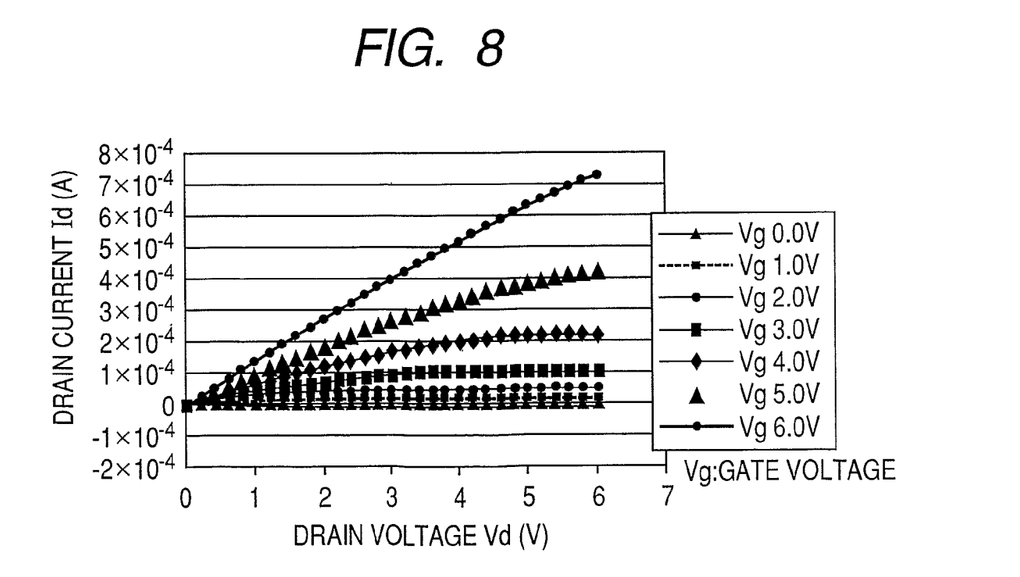
FIG. 8 is a graph showing a current-voltage characteristics of the top-gate MISFET device manufactured in Example 2 of the present invention.

The I-V characteristics of the MISFET device were evaluated during the irradiation of different light beams each having a wavelength of 300 nm to 800 nm (10 nm in interval) at a predetermined light intensity (0.1 mW/cm$^2$) to measure an on-current and an off-current. FIGS. 8 and 9 show results obtained by the measurement.

FIG. 8 shows a result obtained by the I-V characteristic evaluation of the MISFET device and FIG. 9 shows a result obtained by the measurement of the on-current and the off-current. It was confirmed from the results that in the case of the amorphous oxide MISFET device, the off-current and on-current were increased during light irradiation at wavelengths of 450 nm or less and a function of a switching device deteriorated in a region irradiated with light emitted from a blue light-emitting device.

This fact will be specifically described with reference to the case of the display shown in FIG. 5. The gate voltage of the first transistor (switching transistor) 41 of the light-emitting device is maintained at a desirable voltage, so that the first transistor becomes an on-state. It is necessary that such a state be maintained until a next signal is received. However, when the off-current is increased by blue light irradiation at a wavelength of 450 nm or less, the desirable voltage cannot be maintained, so that the light emission cannot be maintained. When the light-emitting device is used for the display, the on-current of the first transistor 41 is changed by a change in light emission intensity of a blue pixel, whereby the light emission intensity is unstable.

EXAMPLE 3

In this example, a light-emitting device in which TFTs were arranged in the red pixel region is manufactured.

First, MISFET devices were formed by substantially the same method as the method used in Example 2. In a series of processes, each layer was formed at a desirable size by a photolithography method and a lift-off method. At this time, TFTs were arranged in the red pixel region as in the case shown in FIG. 2. Then, an insulating layer was formed by the same method and contact holes for a drain electrode were formed therein.

After that, an ITO film was formed in a thickness of 300 nm by a sputtering method to obtain a lower electrode. At this time, drain electrodes were connected with the lower electrode through the contact holes to form wirings. Next, a hole injection layer was formed in a thickness of 60 nm by a resistance evaporation method, and a hole transport layer was formed thereon in a thickness of 20 nm. Then, each of light-emitting layers of red, blue, and green was formed in a thickness of 40 nm by a mask vapor deposition method. Then, an electron transport layer was formed in a thickness of 20 nm. As a whole, an organic light-emitting layer was obtained. Finally, an alloy film of Al and Ag having a thickness of 50 nm and an Al film having a thickness of 50 nm were formed by a two-dimensional vapor deposition method to obtain a counter electrode.

When the manufactured device which was in contact with a probe was driven, light emission was obtained from the rear surface side of the substrate, that is, in the bottom-emission type. In the case of the obtained light-emitting device, it was possible to maintain stable light emission and color display.

In this example, the light emitting device using the organic light-emitting layer is described. However, the present invention is not limited to this. The same effect can be realized even in the case of using a light-emitting device having a divided light emission wavelength range, such as in an inorganic light-emitting layer.

EXAMPLE 4

In this example, a light-emitting device using an organic EL layer was manufactured using the same method as that in Example 3. At the time of transistor formation, as in the case shown in FIG. 3, TFTs were arranged in the red pixel region and the green pixel region. Other methods were the same as those in Example 3. As a result, even in this example, the obtained light-emitting device could maintain stable light emission and perform color display.

EXAMPLE 5

In this example, a both-side emission light-emitting device using an organic EL layer was manufactured.

First, MISFET devices were formed by substantially the same method as used in Example 2. Then, a light-emitting device was produced by the same method as that in Example 3. At the time of upper electrode formation, a transparent electrode (ITO was used here) was formed in a thickness of 20 nm by a sputtering method to obtain an upper transparent electrode. As a whole, an organic light-emitting layer which performs both-side light emission was obtained. As a result, even in this example, the obtained light-emitting device could maintain stable light emission from both sides and perform color display.

The respective examples of the present invention are described in detail. The present invention is not limited to the disclosed respective exemplary examples. Various modifications and changes can be made by a person skilled in the art based on the description of the following claims without departing from the spirit of the present invention. The various modifications and changes are also included in the scope of the present invention.

The light-emitting device according to the present invention can be widely applied to a flexible display obtained by forming a semiconductor thin film on a flexible material including a plastic film, an IC card, an ID tag, and the like.

According to the present invention, it is possible to provide a light-emitting device which is stably operated without using the light shielding unit can be provided as the light-emitting device using the oxide semiconductor thin-film transistor including an oxide which is transparent.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-074631, filed Mar. 17, 2006, which is hereby incorporated by reference herein in its entirety.

The invention claimed is:

1. A light-emitting device, comprising:
a pixel region provided on a substrate and including a blue pixel region, a green pixel region, and a red pixel region which correspond to lights of three primary colors of blue, green and red, respectively, the pixel region including: a thin-film transistor having a source electrode, a drain electrode, a gate electrode, a gate insulating film, and an active layer; a light-emitting layer; and a lower electrode and a counter electrode for sandwiching the light-emitting layer therebetween,
wherein the active layer includes an oxide; the drain electrode is electrically connected with a part of the light-emitting layer; the thin-film transistor is arranged in the pixel region other than the blue pixel region on the substrate and is provided in at least one of the green pixel region and the red pixel region; and the thin-film transistor is provided with no light-shielding film.

2. A light-emitting device according to claim 1, wherein the active layer comprises an oxide having a transmittance of 70% or more to light having a wavelength range of 400 nm to 800 nm.

3. A light-emitting device according to claim 1, wherein the oxide of the active layer contains In, Ga, and Zn, and has an electron carrier concentration smaller than $10^{18}/cm^3$, and at least a part of the oxide is an amorphous oxide.

4. A light-emitting device according to claim 1, wherein at least one of the source electrode, the drain electrode, and the gate electrode comprises a transparent conductive oxide.

5. A light-emitting device according to claim 1, wherein the lower electrode comprises a transparent conductive oxide.

6. A light-emitting device according to claim 1, wherein at least one of the source electrode, the drain electrode, the gate electrode, and the lower electrode contains In, Ga, and Zn, and has an electron carrier concentration of $10^{18}/cm^3$ or more, and at least a part of the oxide is an amorphous oxide.

7. A light-emitting device according to claim 1, wherein the light-emitting layer comprises an organic EL element.

8. An image display apparatus, comprising the light-emitting device according to claim 1.

* * * * *